United States Patent [19]

Lee et al.

[11] Patent Number: 4,686,628
[45] Date of Patent: Aug. 11, 1987

[54] ELECTRIC DEVICE OR CIRCUIT TESTING METHOD AND APPARATUS

[75] Inventors: Keibock Lee, Troy; Robert V. Dvorak, Scotia, both of N.Y.

[73] Assignee: Fairchild Camera & Instrument Corp., Clifton Park, N.Y.

[21] Appl. No.: 632,460

[22] Filed: Jul. 19, 1984

[51] Int. Cl.[4] .................... G01F 15/20; G06G 7/62; G05B 13/02; G01R 31/28
[52] U.S. Cl. .................... 364/481; 364/551; 364/164; 371/25
[58] Field of Search ............ 364/194, 481, 482, 483, 364/550, 551, 557, 164; 324/60 CD; 374/169, 170; 371/25

[56] References Cited

U.S. PATENT DOCUMENTS 3,978,325  8/1976  Goldstein et al. ............ 364/557 X
4,176,556 12/1979  Takenaka ..................... 364/557 X
4,455,612  6/1984  Girgis et al. .................. 364/483
4,569,012  2/1986  Sekozawa ..................... 364/164
4,574,359  3/1986  Ishizaka et al. ............... 374/169 X

OTHER PUBLICATIONS

Moore et al., "Improved Algorithm for Direct Digital Control", *Instruments and Control Systems*, Jan. 1970, pp. 70-74.

*Primary Examiner*—Errol A. Krass
*Assistant Examiner*—Joseph L. Dixon
*Attorney, Agent, or Firm*—Ladas & Parry

[57] ABSTRACT

A method and apparatus for testing an electrical device and/or circuit in which the device or circuit is stimulated with a known input signal and in which three or more measurements of the response of the device or circuit to such stimulus are taken and utilized to predict a final value of such response according to a predetermined relationship between such predicted final response and the measured response values. Typically the present invention can predict such final value without waiting for the actual final value of the response to occur.

12 Claims, 5 Drawing Figures

ELECTRIC DEVICE OR CIRCUIT TESTING METHOD AND APPARATUS

BACKGROUND OF THE INVENTION

The present invention relates to a method and apparatus for testing electrical devices, particularly analog electrical devices.

A conventional test system 10 utilized to test an analog device 11 is illustrated in FIG. 1. Since the device 11 to be tested is typically one component of many components embedded within a printed circuit board (not shown), it is necessary to establish electrical contact with this device within its associated circuit. Thus, such a test system 10 includes one or more pin probes 13 which are electrically connected through a switching and amplifier matrix 14 to an electric test assembly. This electric test assembly has a controller or processor 15, as well as a stimulus section 16 and a measurement section 17, which are controlled by the processor 15. Typically a clock or sequencer 18 is also connected to the processor 15 to afford the timing and sequencing of the stimulus and the measurement sections.

The stimulus section 16 of system 10 is capable of generating a stimulus signal (such as a voltage step function) having a known and constant magnitude after some time "$T_0$". This stimulus signal is applied to the device 11 under test through the probes 13. For example, a stimulus voltage could be applied at node 20 in order to cause a current to flow through the device 11. The resulting current flowing through the device 11 and the resulting voltage drop across the device 11 could then be measured at node 21. It is readily apparent, for example, that the impedance of the device 11 under test can be determined from the voltage drop across the device 11 and the current flowing through the device 11. This determined impedance can then be compared to the known impedance of a comparable functioning device, derived either by calculation from the known parameters of the device, or by measuring a comparable device known to be good. This derived value for the impedance of a functioning device can be provided as an input to the processor 15 at terminal 19. If the determined response is substantially equivalent to the derived or known response for a functioning device, the component under test is considered acceptable and functioning properly. If however the determined response differs from the calculated or measured response by more than a predetermined range of tolerance, the device under test is assumed to be defective.

Such conventional test systems as described above are not however, able to efficiently test circuits or devices having a response that varies with time, e.g. circuits containing either capacitance or inductance therein. In such circuits the response to the stimulus signal is neither immediate nor constant. Rather there is a rise time and a settling time associated with such circuits. It is not abnormal in such circuits to have a settling time in the range of from 2 milliseconds to 5 seconds after the stimulus signal has been applied. In order to accurately determine whether the component is acceptable or defective, the conventional testing systems wait for the response to substantially settle to its final value before making a measurement in order for the ultimate comparison to have a significance. This wait time substantially increases the time required to test a device or the printed circuit board containing the time varying device.

SUMMARY OF THE PRESENT INVENTION

A fundamental objective within electronic device testing equipment is the achievement of the highest feasible level of accuracy for the test while contemporaneously achieving the fastest test times. The present invention proposes a method and an apparatus for achieving significant decreases in the time required to test analog devices without sacrificing substantial accuracy.

The test system of the present invention applies a predetermined input signal in the conventional manner to the device under test, e.g. a predetermined constant voltage is applied to an input node of the device. A first measurement of the response of the device to this input signal is taken. Typically this measurement is made a short time after the application of the stimulus, i.e. after a time sufficient for the effects of the switching circuitry connecting the stimulus to the device to have passed, but substantially prior to time required by the circuit or device to have reached a final, settled value. A second and a third measurement of the response of the device to the stimulus are also taken, with an equivalent time delay between measurements.

This time delay between measurements is chosen to be small compared to the steady-state settle time for the device; thus the three measurements typically differ in magnitude due to the time varying effects of the device and the circuits associated therewith. Based upon a derived relationship of these measured values, the present invention predicts the final value (i.e. the value after all the transients have settled) for the response of the device 11 to the stimulus signal. This predicted value is calculated without waiting for the response to actually settle to its final value. Since the actual response to such an input signal of a comparable device known to be functioning can be derived, i.e. measured or calculated from the known parameters of the device, the predicted response can be compared to the derived response in the conventional manner to determine their equivalence. If the device under test is functioning properly, this predicted value will be substantially equivalent to the derived value.

Thus the method and apparatus of the present invention can be utilized to accurately test a device without requiring that the system wait for the device to reach steady state. This allows the testing of the device to be performed in a fraction of the time required by conventional testers which wait for the device to reach steady state prior to making a measurement.

BRIEF DESCRIPTION OF THE DRAWING

The present invention will be further described herein with reference to the accompanying drawing wherein.

DETAILED DESCRIPTION

Figure 1:
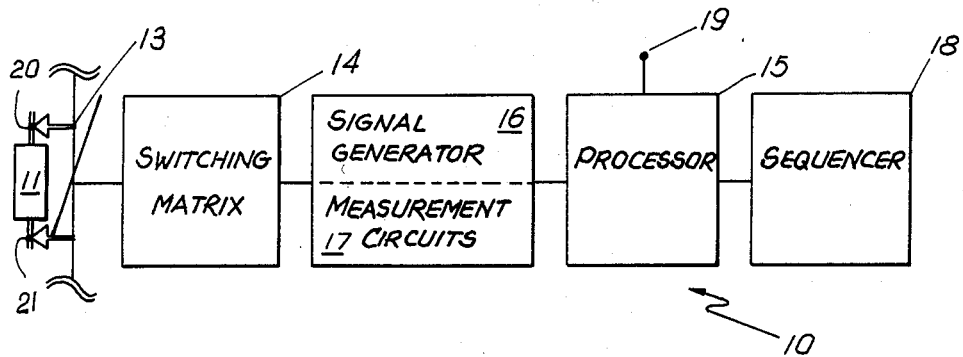
FIG. 1 is a schematic diagram of a prior art testing circuit.
Figure 2:
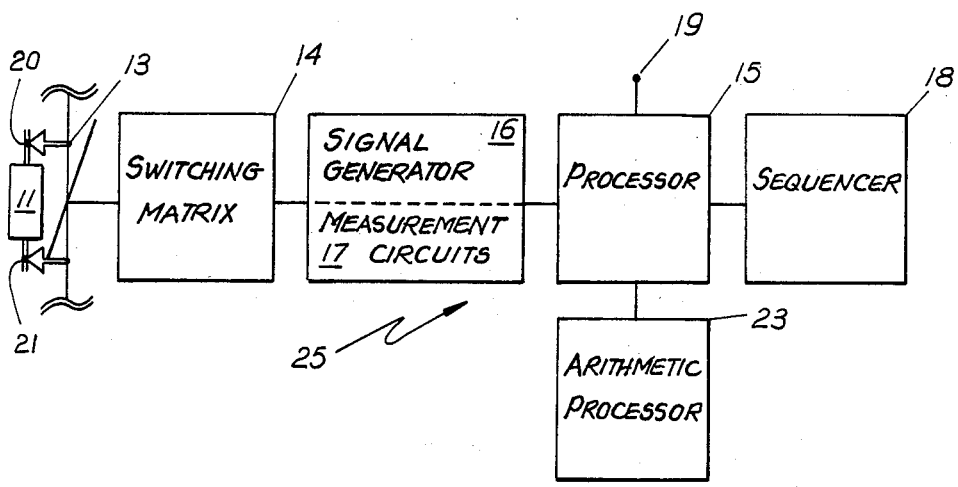
FIG. 2 is a schematic diagram of a testing system according to the present invention.

A schematic diagram of a test system 25 according to the present invention is illustrated in FIG. 2, wherein the device 11, which is to be tested, i.e. typically one or more individual components within a printed circuit board, is brought into electrical contact with probes 13 and thus with switching matrix 14. Such probes 13 and switching matrix 14 are of conventional design and need not be further explained to those skilled in the art. The parameters of the device 11 which are necessary to make a decision as to whether the device is functioning or not functioning are also programmed into the system 25. Such parameters would include not only the specific impedance, capacitance, or inductance values, or desired current and voltage levels, etc. for example, but also the acceptable tolerance ranges for the devices. Typically the configuration of the entire circuit board which is to be tested, including a description of the devices contained therein and their specific interconnections has been programmed into the system 25 such that the probes 13 can be correctly positioned to contact specific test points, e.g. as nodes 20 and 21 on the printed circuit board, such that the matrix 14 can be switched at the appropriate times to electrically connect the signal generator 16 and the measurement circuit 17 to the appropriate nodes, and such that appropriately shaped stimulus signals are generated. The signal generator 16 and measurement circuit 17 are also considered conventional in design and will not be further described herein. Once this data is determined for a particular circuit board it is typically stored in a retrievable format such as on magnetic tape or disks which can be loaded into a conventional processor 15 in a conventional manner such as through input terminal 19, to initialize the parameters for the test, whenever that particular board is to be tested.

Upon instruction by the processor 15, the signal generator 16 provides the appropriate stimulus signal to the probes 13 through the matrix 14. For example, a DC voltage of a predetermined magnitude can be applied at node 20. The processor 15 simultaneously sends a signal to to the timer 18 that the stimulus signal has been applied, and instructs the matrix 14 to electrically connect the measurement circuit 17 to node 20 and 21 via probes 13. Since the switching circuits involved within the matrix 14 can introduce transient into the measurement circuit, the processor 15 typically waits a predetermined time before taking the first measurement, which time is a function of the particular switching circuits utilized. In the preferred embodiment this time is typically in the order of 1.5 milliseconds. After this initial wait time a first measurement is made at node 21 of the response of device 11 to the input stimulus. Since such measurement circuit 17 typically includes an amplifier, an RMS to DC converter, a DC scaling circuit, and an analog to digital converter, the measurement can be stored in a digital format. In the preferred embodiment this storage is done within standard memory units within the processor 15.

Before proceeding further it should be noted that the present invention as thus far described has been illustrated by block representations which show only those specific details that are pertinent to the present invention. This has been done so as not to obscure the disclosure with structured details which will be readily apparent to those skilled in the art having the benefit of the description herein. Accordingly, the block diagram illustrations may not necessarily represent the precise mechanical structural arrangement of an exemplary test system, but rather are primarily intended to depict the major components of such a system in a convenient functional grouping in light of which the present invention may be more readily understood.

The relationship developed to predict the final value as part of the present invention has been empirically as well as theoretically derived and can be proven algebraically. It is based upon the assumptions that the input to the device is a basic first order step function, as well as the assumption that the measurement system has a dominant real pole such that it can be approximated as a first order system. This latter assumption is valid since compensation capacitors are typically utilized within the measurement circuitry. The resulting derived relationship is as follows:

$$\text{The final response} = \frac{Y^2 - XZ}{2Y - X - Z}$$

Where X, Y, and Z are samples taken at times $T_1$, $T_2$ and $T_3$ respectively.

This relationship requires three measurements to be taken with an equivalent time delay there between. The optimum time "T" between measurements is a function of the speed at which the response is changing, i.e. insignificant variance in the magnitude of the response signifies a response that has either substantially settled to its final value or a response being sampled too rapidly to measure any variance therein. Although a fast sampling rate is desirable to afford a rapid calculation of the predicted value, the time between measurements must be significantly large to afford a sufficiently large voltage or response variation to result in an acceptable signal to noise ratio for the predicted value calculation. A number of methods can be used to determine an optimum time "T", both apriori (through calculations based upon the parameters of the device being tested) or dynamically (based upon the actual variation in the response), to be utilized by the present invention. In the preferred embodiment a "T" is initially chosen which is known to be small in view of the parameters of the device 11 being tested. Measurements of the response are then made with this between-measurement interval being extended dynamically until the magnitude of the measured response equals approximately 12% of the expected final value, i.e. the derived value. The resulting "T" at which this value is achieved is utilized as the "T" between the measurements thereafter made and used to calculate the predicted final value. These calculations can be quickly made by the arithmetic processor 23 under the control of the processor 15. It should be apparent to these skills in the art, however, that other methods for calculating a value for "T" may be equally viable.

To facilitate the timing accuracy of these measurements the present invention restarts the timer 18 prior to taking each measurement. This eliminates any variation in the time between measurements due to a variation in the time taken for performing the measurement. In the simplest embodiment of the present invention all three measurements are made prior to any calculations for predicting the final value. Once taken, the three values are provided as inputs to a conventional arithmetic processor 23 in which the predicted final value is calculated.

Once the final response or voltage is predicted, it is compared to the derived value for such response which has been previously stored in the processor 15. Typically such comparison will have a range of tolerance over which a component will be found acceptable. This tolerance range has be programmed into the processor 15 during the initiation of the parameters as has already been described. Thus the device 11 under test will either be rejected or accepted. This status can be indicated by a message on the screen of a CRT, the generation of a printout, the lighting of indicators, etc.

Figure 3:
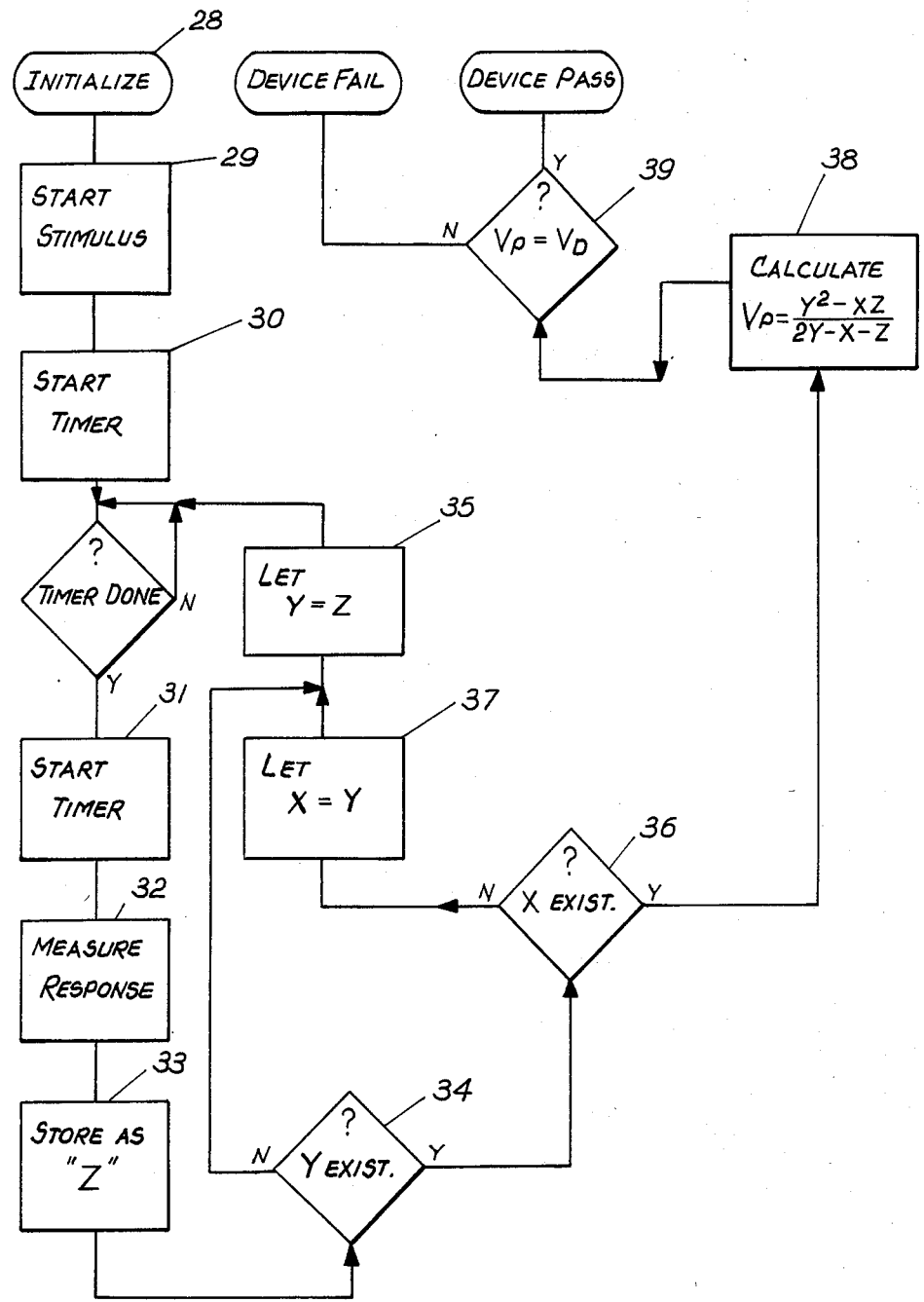
FIGS. 3 through 5 are functional block diagrams of three embodiments of a method for testing analog devices according to the present invention.

The steps thus far described are illustrated in FIG. 3. As can be seen instruction 28 initializes the processor 15 with the testing parameters including the derived valued and the tolerance range for the device 11 under test. Instruction 29 causes the switching matrix 14 to electrically connect the appropriate probes 13 to the signal generator 16, and also causes the signal generator 16 to apply the appropriate stimulus signal to the nodes of the device 11. The application of the stimulus signal activates the timer 18 as is indicated by instruction 30. Instruction 30 also causes the switching matrix to connect the appropriate probes to the measurement circuit 17. Since the accurate control of the elapsed time between measurements is critical, instruction 31 restarts the timer as soon as the programmed time delay has expired. A first measurement of the response of the device to the stimulus signal is then taken as a result of instruction 32. This measurement is identified as measurement "Z" and stored in the processor 15 by instruction 33. If this is the first measurement, instruction 34 will respond with a "no" and instruction 35 will cause the first measurement to also be stored as measurement "Y". Upon expiration of the programmed time delay of timer 18, instructions 31 through 34 will be repeated and the second measurement will be stored as measurement "Z". Since measurement "Y" now exists (i.e., the first measurement) control will pass to instructions 36 and 37 which result in the first measurement being identified as measurement "X" and the second measurement being identified as measurement "Y". After the expiration of the programmed time delay instructions 31 through 34 and 36 are again repeated, only this time control passes to instructions 38 since all three measurements now exist, I.E. X=first measurement, Y=second measurement, Z—third measurement. It can be seen by one skilled in the art that steps 33 through 37 function as a loop to ensure that the appropriate number of measurements are made. This result can also be achieved by other instruction sets which are considered to be equivalent to those described herein and thus within the scope of the present invention.

Instruction 38 causes the processor 15 and the arithmetic processor 23 to process the measured values according to a mathematical relationship derived to predict the final value of the responses to the stimulus, i.e. the value which would occur at some time "Tf", which is greater than the settling time. Once this value is calculated it can be compared to the determined value which has been programmed into the processor 15 during step 28. As has already been stated, substantial equivalence (i.e. within the programmed tolerance range) between the predicted value and the determined value will lead to a conclusion that the device under test is functioning properly.

Figure 4:
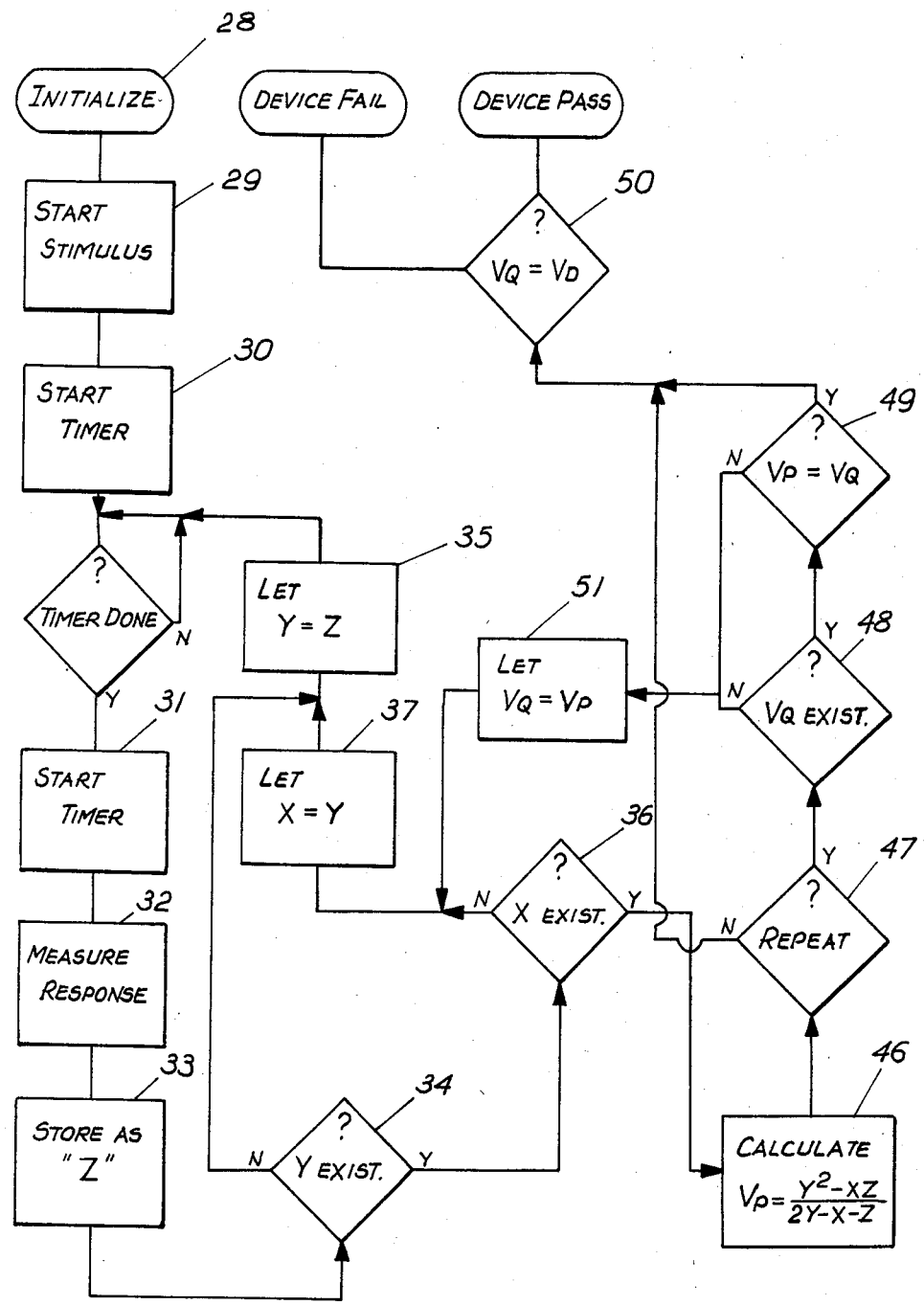

Although the simple embodiment thus far described is effective for testing a variety of circuits it is not totally satisfactory in all cases. Greater accuracy, for example, can be achieved by repeating this method and looking for a consistency between the final predicted values before comparing the predicted value to the determined value as illustrated by instructions 47–51 of FIG. 4 (wherein instructions which are common to the embodiment illustrated in FIG. 3 remain numbered as on FIG. 3). This repetition is particularly useful for circuits having a large time constant, (i.e. a long settling time). If after multiple repetitions, the predicted final value remains relatively constant, there can be greater assurance that the method is indeed working with the particular circuit. Since the time delay between measurements is typically quite small compared to the total elapsed time for the response to each steady-state, the multiple repetitions of the method according to the present invention can still be performed in substantially less time than conventional test systems which wait for the response to fully settle.

Figure 5:
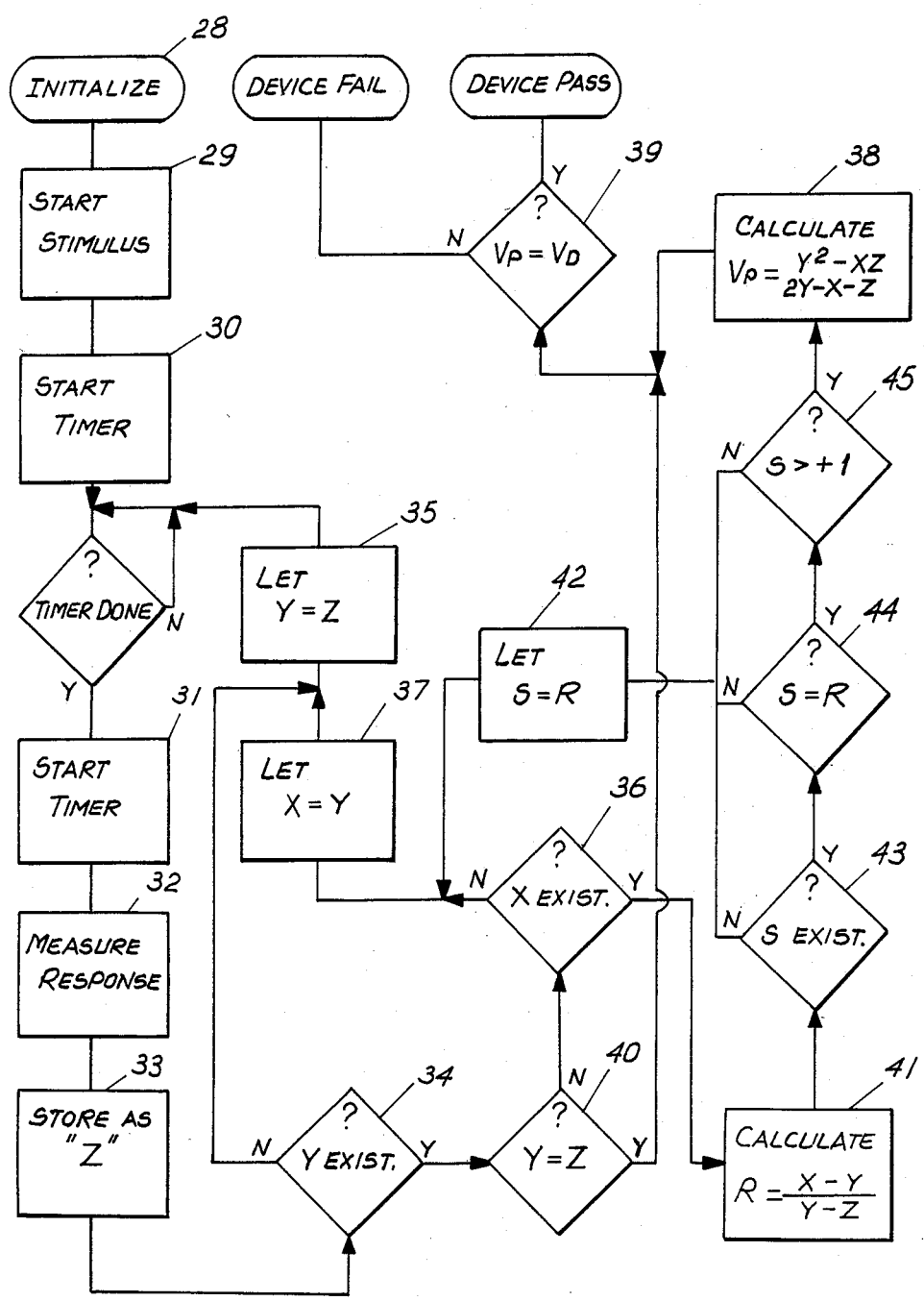

Similarly the accuracy and speed of the above method can be further increased by including some additional method steps as are shown in the embodiment illustrated in FIG. 5 (wherein instructions which are common to the embodiment illustrated in FIG. 3 remain numbered as in FIG. 3). As can be seen, instructions 28 through 35 remain identical. With this embodiment however, the existence of a second measurement will lead to instruction 40 which compares the two most recent measurements. If such measurements are substantially equivalent, i.e. within a programmed tolerance range, an assumption can be made that the response has already reached a steady state or final value. Thus instruction 39 can be applied to make the comparison between the measured response and the derived response to determine whether or not the device 11 is functioning properly, without processing instruction 38. Accordingly both time and memory space can be saved. If however the measurements are not substantially equivalent, instruction 36 is processed. Depending upon whether a third measured value is currently in memory, either instruction 37 or 41 will then be processed. Instruction 37 leads into the measurement loop which has already been discussed. Instruction 41 however, determines the ratio of the difference between the first and second measured values to the difference between the second and third values. (The nomenclature third, second and first is used for convenience to indicate the most recent measurement, the prior measurement and the measurement before the prior measurement, respectively.) This ratio is then stored in the processor 15 as ratio "R". If only three measurements are in memory this ratio is also stored as ratio "S" and a fourth measurement is made in the conventional manner via instructions 37, 35 and 31 through 33. Instruction 41 is again processed and the ratio "R" is calculated and stored utilizing the second, third and fourth measurement. The ratio "S" however now exists due to the initial processing of instructions 41 and 42. Thus instruction 43 is processed. Empirical investigations with the present invention have determined that the test method according to the present invention is more efficient and potentially more accurate when the ratios as calculated by instruction 41 are substantially equal. This premise has also been mathematically confirmed. Similarly greater accuracy is achieved when the ratios are positive and greater than unity. Instruction 44 makes this determination. If either of these conditions is not met, another measurement is made via instruction 42, 37, 35 and 31 through 33, and another ratio is calculated. Such conditions can be determined in a conventional manner by the arithmetic processor 23. This process is repeated until the conditions hold true.

In the preferred embodiment the occurrence of both of the conditions set forth by instructions 43 and 44 will result in the calculation of the predicted final value via instruction 38 and a determination of the condition of the device via instruction 39 as has already been described. Typically such a determination can be made within a fraction of the time required for the response to fully settle. The actual time taken is, however, dependent upon the time constant of circuit being tested. For most circuits the time taken to predict the final value is approximately one half of this time constant.

It can be seen that the present invention affords a determination of the condition of the device under test in substantially less time than conventional testing systems which are currently available. Furthermore such reduction in test time can be accomplished with minimal reduction in accuracy for most circuits.

While we have shown and described multiple embodiments of the present invention it will be understood that the such invention is not limited thereto, but rather that changes and modifications may be made to the configuration or identity of some of the parts and/or the order or identity of some of the method steps described and as would be known to a person skilled in the art, without departing from the present invention as set forth in the appended claims. We therefore do not wish to be limited to the details shown and described herein but intend to cover all such changes and modifications as are obvious to one of ordinary skill in the art.

What is claimed is:

1. A method for testing an analog device comprising
   (a) applying a pre-determined input signal to the device,
   (b) taking a first measurement of the response of the device resulting from the input signal,
   (c) waiting a predetermined time T and taking a second measurement of the response of the device resulting from the input signal,
   (d) waiting the same predetermined time T as in step (c) and taking a third measurement of the response of the device resulting from the input signal,
   (e) predicting the final value of the response from the measured values without waiting to actually measure the final value, and
   (f) repeating steps (a) through (e) and comparing the predicted final values;
   (g) comparing the predicted final response to a known response value derived from a functioning device when the predicted final values compared in step (f) are substantially equivalent.

2. A method according to claim 1 wherein said final value is predicted according to the following relationship:

$$\text{predicted final response} = \frac{Y^2 - XZ}{2Y - X - Z}$$

wherein
   X equals the first measured value,
   Y equals the second measured value and
   Z equals the third measured value.

3. A method according to claim 1 further comprising comparing the second measurement to the first measurement and performing Step (d) only when the first and second measurements differ by more than a predetermined value.

4. A method according to claim 1 further comprising comparing the difference between the first and second measurements to the difference between the second and third measurements, and performing step (e) only when the ratio of the difference between the first and second measurements to the difference between the second and third measurements is positive and greater than unity.

5. A method according to claim 1 wherein step (d) further comprises waiting the same predetermined time T as in step (c) taking a fourth measurement of the response of the device resulting from the input signal, deriving a ratio of the difference between the first and second measurement to the difference between the second and third measurements, deriving a ratio of the difference between the second and third response to the difference between the third and fourth measurements, comparing the ratio of the difference between the first and second measurements to the difference between the second and third measurements to the ratio of the difference between the second and third measurements to the difference between the third and fourth measurements and performing step (e) only when such compared ratios are equal, positive and greater than 1.

6. A method according to claim 5 wherein said final value is predicted according to the following relationship:

$$\text{predicted final response} = \frac{Y^2 - XZ}{2Y - X - Z}$$

wherein
   X equals the first measured value,
   Y equals the second measured value and
   Z equals the third measured value.

7. A system for testing an analog device comprising
   a signal generator for stimulating the device with a predetermined electrical signal,
   means for taking at least three measurements of the response of the device to the stimulus signal, which measurements are separated by a predetermined and equal time delay,
   circuit means for selectively electrically connecting and/or disconnecting said measurement means and said signal generator to the device,
   means for predicting the final value of the response of the device to the stimulus signal from the measured values,
   according to the following relationship:

$$\text{predicted final response} = \frac{Y^2 - XZ}{2Y - X - Z}$$

wherein
   X equals the first measured value of the response,
   Y equals the second measured value of the response, and
   Z equals the third measured value of the response, and
   means for comparing the predicted final response to a response value derived from a functioning device thereby evaluation whether the device under test is functioning or not functioning.

8. A system for testing an analog device comprising
   a signal generator for stimulating the device with a predetermined electrical signal,
   means for taking at least three measurements of the response of the device to the stimulus signal, which measurements are separated by a predetermined and equal time delay, circuit means for selectively electrically connecting and disconnecting said measurement means and said signal generator to the device, means for comparing the ratio of difference between the first and second measurements to the difference between the second and third measurements, means for predicting the final value of the response of the device to the stimulus signal from the measured values according to the following relationship when such ratio is positive and greater than unity:

$$\text{predicted final response} = \frac{Y^2 - XZ}{2Y - X - Z}$$

wherein
X equals the first measured value of the response,
Y equals the second measured value of the response, and
Z equals the third measured value of the response and means for comparing the predicted final response to a response value derived from a functioning device thereby evaluation whether the device under test is functioning or not functioning.

9. A systme for testing an analog device comprising a signal generator for stimulating the device with a predetermined electrical signal, means for taking at least three measurements of the response of the device to the stimulus signal which measurements are separated by a predetermined and equal time delay, circuit means for selectively electrically connecting and disconnecting said measurement means and said signal generator to the device, means for comparing the ratio of difference between the first and second measurements to the difference between the second and third measurements, means for comparing the ratio of the difference between the second and third measurements to the difference between the third and fourth measurements, means for predicting the final value of the response of the device to the stimulus signal from the measured values according to the following relationship when such ratios are equal, positive, and greater than unity:

$$\text{predicted final response} = \frac{Y^2 - XZ}{2Y - X - Z}$$

wherein
X equals the second measured value of the response,
Y equals the third measured value of the response, and
Z equals the fourth measured value of the response, and means for comparing the predicted final response to a response value derived from a functioning device thereby evaluating whether the device under test is functioning or not functioning.

10. In a method for testing an electric device including stimulating the device with a predetermined input signal and measuring the response of the device to the stimulus signal, the improvement comprising
  (a) taking at least three measurements of the response of the device to the stimulus signal, which measurements are separated by a predetermined and equal time delay,
  (b) predicting the final value of the response of the device to the stimulus signal according to the following relationship:

$$\text{predicted final response} = \frac{Y^2 - XZ}{2Y - X - Z}$$

wherein
X equals the first measured value of the response,
Y equals the second measured value of the response, and
Z equals the third measured value of the response, and
  (c) comparing the predicted final response to a predetermined response for a device known to be functioning.

11. The method according to claim 10 further comprising repeating steps (a) and (b), comparing the predicted final values, and performing step (c) using the latest predicted final response only when such values are substantially equivalent.

12. The method according to claim 10 further comprising waiting the same predetermined time T as in step (a) and measuring a fourth response of the device resulting from the input signal, deriving a ratio of the difference between the first and second measurement to the difference between the second and third measurements, deriving a ratio of the difference between the second and third response to the difference between the third and fourth measurements, comparing the ratio of the difference between the first and second measurements to the difference between the second and third measurements to the ratio of the difference between the second and third measurements to the difference between the third and fourth measurements and performing step (b) only when such compared ratios are equal, positive and greater than 1.

* * * * *